(12) United States Patent
Park

(10) Patent No.: US 8,530,754 B2
(45) Date of Patent: Sep. 10, 2013

(54) PRINTED CIRCUIT BOARD HAVING ADAPTABLE WIRING LINES AND METHOD FOR MANUFACTURING THE SAME

(75) Inventor: Shin Young Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 938 days.

(21) Appl. No.: 12/329,769

(22) Filed: Dec. 8, 2008

(65) Prior Publication Data
US 2009/0223709 A1    Sep. 10, 2009

(30) Foreign Application Priority Data
Mar. 7, 2008   (KR) .......................... 10-2008-0021586

(51) Int. Cl.
*H05K 1/11*    (2006.01)
(52) U.S. Cl.
USPC .......................................................... 174/263
(58) Field of Classification Search
USPC ......................................... 174/263; 438/107
See application file for complete search history.

(56) References Cited

U.S. PATENT DOCUMENTS

| | | | | |
|---|---|---|---|---|
| 5,209,817 A * | 5/1993 | Ahmad et al. | ................... | 216/18 |
| 5,834,844 A * | 11/1998 | Akagawa et al. | ............. | 257/734 |
| 6,331,679 B1 * | 12/2001 | Higashi | .......................... | 174/260 |
| 6,544,813 B1 * | 4/2003 | Lin | ................................ | 438/107 |
| 6,660,626 B1 * | 12/2003 | Lin | ................................ | 438/618 |
| 7,659,142 B2 * | 2/2010 | Hashimoto | ................... | 438/106 |
| 2005/0104288 A1 * | 5/2005 | Omomo | ..................... | 273/142 R |
| 2006/0284821 A1 * | 12/2006 | Takenaka | ...................... | 345/100 |

FOREIGN PATENT DOCUMENTS

| | | |
|---|---|---|
| JP | 06-120656 A | 4/1994 |
| JP | 2007-012662 A | 1/2007 |
| KR | 100274333 B1 | 9/2000 |
| KR | 100641564 B1 | 10/2006 |

* cited by examiner

*Primary Examiner* — Chau Nguyen
(74) *Attorney, Agent, or Firm* — Ladas & Parry LLP

(57) ABSTRACT

A printed circuit board having adaptable wiring lines includes an insulation layer. Electrode terminals and ball lands are formed on an upper surface of the insulation layer and are separated from each other. Wiring patterns are formed on the insulation layer, interposed between the electrode terminals and the ball lands, and partially removed in a region between the electrode terminals and the ball lands. Conductive members are selectively formed in the regions where the wiring patterns are partially removed to selectively connect the electrode terminals and the ball lands.

15 Claims, 10 Drawing Sheets

PRINTED CIRCUIT BOARD HAVING ADAPTABLE WIRING LINES AND METHOD FOR MANUFACTURING THE SAME

CROSS-REFERENCE TO RELATED APPLICATIONS

The present application claims priority to Korean patent application number 10-2008-0021586 filed on Mar. 7, 2008, which is incorporated herein by reference in its entirety.

BACKGROUND OF THE INVENTION

The present invention relates generally to a printed circuit board and a method for manufacturing the same, and more particularly to a printed circuit board having conductive members and a method for manufacturing the same.

The recent design trend in integrated circuit chips is miniaturization. As the size of an integrated circuit chip is decreased the integration level of an integrated circuit chip increases accordingly, and therefore the number of circuits that can be located on a chip is increased as well. This increase in the number of circuits that can be located on a chip means that an increased number of signals can be inputted to and outputted from the integrated circuit chip. Therefore, due to this miniaturization, it is necessary to locate an increased number of input and output pins within a limited area of a semiconductor package.

A ball grid array (BGA) package has been developed and used to provide an increased number of input and output pins within a limited area of a semiconductor package. The BGA package uses mounting technology that employs a printed circuit board having high mounting density and high precision so that an increased number of parts, (i.e., semiconductor chips) can be mounted.

In order provide light, compact and slim electronic appliances, techniques for finely forming parts are required, and a printed circuit board for enabling high density mounting of parts must be provided.

In general, a printed circuit board includes line patterns made of a conductive material, such as copper, which are formed on an insulation layer immediately before mounting electronic parts. More specifically, a printed circuit board includes an insulation layer, metal lines, which are formed on surfaces of the insulation layer, and via metal lines, which are formed through the insulation layer so as to electrically connect the metal lines formed different surfaces of the insulation layer.

Conventional lead frame package include input and output pins that are one-dimensionally arranged along the edges of a chip. In contrast to the conventional lead frame package, in the BGA package solder balls are used as input and output pins. The solder balls are arranged two-dimensionally on a surface of a chip, and as such, pins can be located more efficiently than in the conventional lead frame package. Hence, in a printed circuit board to be used in a package such as the BGA package, ball lands should be necessarily formed on the surfaces thereof in order to attach solder balls.

In BGA packages, which use printed circuit boards having ball lands, slight modifications are made to the design of a BGA package in order to make similar printed circuit boards using the same or similar semiconductor chips.

However, in the conventional BGA packages, it may be difficult to manufacture a printed circuit board by bonding solder balls in conformity with the kinds of various packages on the same printed circuit board.

For example, in the case of a flip chip BGA package, which includes bumps for connecting bonding pads on a semiconductor chip with a printed circuit board in one-to-one correspondence, a slight design change may be possible by partially removing portions of the bumps.

Nevertheless, in the flip chip BGA package, the potential for design change is quite limited, and limitations necessarily exist in moving circuit lines connected between solder balls and bumps or changing the circuit lines by selectively connecting solder balls connected with various respective different signals to one bonding pad.

That is to say, a design change of circuit lines by selectively bonding solder balls connected with respective different signals to one ball land in conformity with the types of respective desired packages may be impossible to perform on the same printed circuit board.

Accordingly, even though printed circuit boards having basically the same design of circuit lines are adopted for respective types of packages, in the conventional BGA packages, printed circuit boards suitable for the respective packages must be newly designed and manufactured. Due to this fact, when changing the design of a printed circuit board, masks for forming the newly designed circuit lines, etc. must also be manufactured.

Further, due to the limitations of the conventional BGA packages, small changes result in increased costs because the printed circuit board must be newly designed and the processing time is increased due to the required manufacture of the newly designed printed circuit board.

SUMMARY OF THE INVENTION

Embodiments of the present invention include a printed circuit board in which the design of circuit wiring lines can be changed to be adapted for the different kinds of packages, and a method for manufacturing the same.

Embodiments of the present invention also include a printed circuit board in which the design of circuit wiring lines can be changed to be adapted for the different kinds of packages, thereby preventing an additional manufacturing time and costs from being incurred, and a method for manufacturing the same.

In one embodiment of the present invention, a printed circuit board comprises an insulation layer; electrode terminals located on an upper surface of the insulation layer; ball lands located on the upper surface of the insulation layer and separated from the electrode terminals; wiring patterns located on the insulation layer, interposed between the electrode terminals and the ball lands, and partially removed; and conductive members selectively formed in regions where the wiring patterns are partially removed.

The conductive members comprise any one of an ACF, an ACI, and a conductive polymer.

The conductive members are formed to be pressed and electrically connect the wiring patterns.

The printed circuit board further comprises a solder resist applied over the insulation layer.

The solder resist has a shape that exposes only the conductive members.

The solder resist has a shape that covers the conductive members.

In another embodiment of the present invention, a printed circuit board comprises an insulation layer; electrode terminals located on an upper surface of the insulation layer; ball lands located on the upper surface of the insulation layer and separated from the electrode terminals; and wiring patterns located on the insulation layer, interposed between the electrode terminals and the ball lands, and composed of connection wiring lines which are partially removed and conductive members which are formed in regions where the connection wiring lines are partially removed.

The conductive members comprise any one of an ACF, an ACI, and a conductive polymer.

The conductive members are formed to be selectively pressed and electrically connect the connection wiring lines.

The printed circuit board further comprises a solder resist applied over the insulation layer.

The solder resist has a shape that exposes only the conductive members.

The solder resist has a shape that covers the conductive members.

In still another embodiment of the present invention, a method for manufacturing a printed circuit board comprises the steps of forming an insulation layer which has electrode terminals and ball lands separated from the electrode terminals, on an upper surface thereof; and forming wiring patterns on the insulation layer to be interposed between the electrode terminals and the ball lands and to be composed of connection wiring lines which are partially removed and conductive members which are formed in regions where the connection wiring lines are partially removed.

The conductive members are formed using any one of an ACF, an ACI, and a conductive polymer.

After the step of forming the wiring patterns, the method further comprises the step of pressing selectively the conductive members such that the electrode terminals and the ball lands are electrically connected with each other.

After the step of forming the wiring patterns, the method further comprises the step of applying a solder resist over the insulation layer including the conductive members.

In the step of applying the solder resist, the solder resist is formed to expose only the conductive members.

In the step of applying the solder resist, the solder resist is formed to cover the conductive members.

After the step of forming the solder resist, the method further comprises the step of pressing selectively the conductive members such that the electrode terminals and the ball lands are electrically connected with each other.

DESCRIPTION OF SPECIFIC EMBODIMENTS

In a printed circuit board according to embodiments of the present invention, wiring patterns are formed on an insulation layer having electrode terminals and ball lands so as to connect the electrode terminals and the ball lands with each other. Portions of the wiring patterns are partially removed and conductive members are selectively formed in regions where the wiring patterns are partially removed.

In the regions where the wiring patterns are partially removed and the conductive members are selectively formed, the conductive members are formed to be presded or not to be pressed in conformity with the requirements of a package, and the electrode terminals and the ball lands are electrically connected with or disconnected from each other.

The present invention provides vast improvements upon the conventional art, in which the design of a printed circuit board is changed depending upon the kinds of respective packages, since according to embodiments of the present invention it is possible to selectively connect the ball lands and the electrode terminals through the conductive members which are selectively formed in the regions where the wiring patterns are partially removed. As such, according to embodiments of the present invention, it is not necessary to change the design of a printed circuit board depending upon the requirements of respective packages.

That is to say, in embodiments of the present invention, it is not necessary to change the design of a printed circuit board depending upon the kinds of the respective packages because solder balls to be connected with respective different signals through the conductive members can be attached to and electrically connected with one ball land in a selective manner to be adapted for the respective different types of packages.

Therefore, in the present invention, any additional manufacturing time and costs that will be incurred to change the design of a printed circuit board become unnecessary.

Hereafter, the specific embodiments of the present invention will be described in detail with reference to the accompanying drawings.

Figure 1:
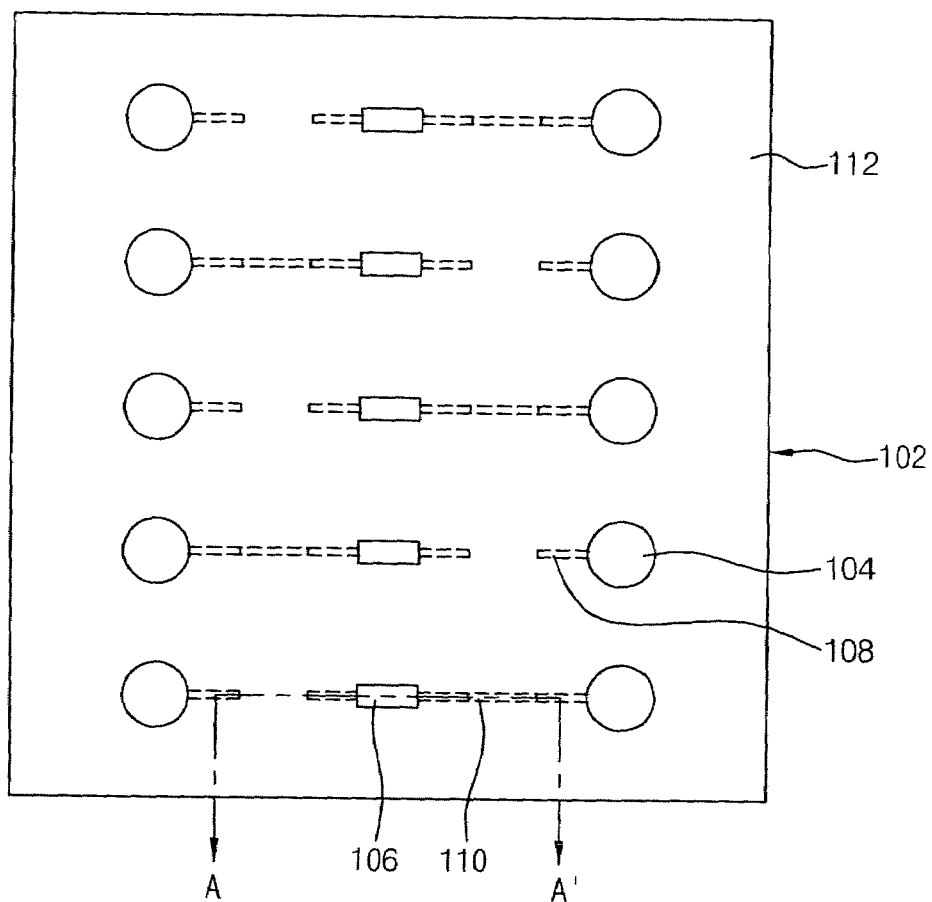
FIG. 1 is a plan view showing a printed circuit board in accordance with a first embodiment of the present invention.
Figure 2:
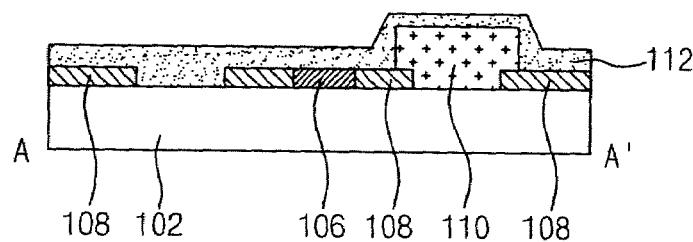
FIGS. 2 and 3 are cross-sectional views taken along the line A-A' of FIG. 1, showing two exemplary printed circuit boards in accordance with the first embodiment of the present invention.
Figure 3:
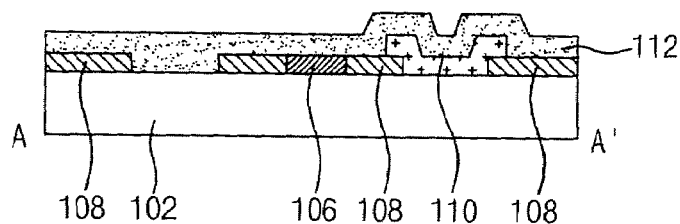
Figure 4:
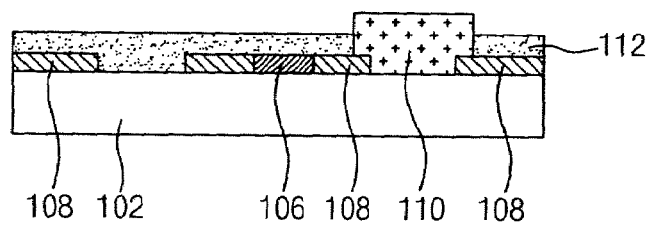
FIGS. 4 and 5 are cross-sectional views showing the printed circuit board in accordance with the first embodiment of the present invention.
Figure 5:
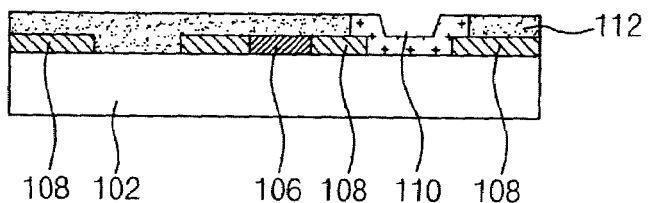

FIG. 1 is a plan view showing a printed circuit board in accordance with a first embodiment of the present invention, FIGS. 2 and 3 are cross-sectional views taken along the line A-A' of FIG. 1, showing two exemplary printed circuit boards in accordance with the first embodiment of the present invention, and FIGS. 4 and 5 are cross-sectional views showing the printed circuit board in accordance with the first embodiment of the present invention. The printed circuit board in accordance with the first embodiment of the present invention will be described below.

Referring to FIG. 1, in a printed circuit board 100 for a package in accordance with a first embodiment of the present invention, wiring patterns 108 are formed on an insulation layer 102. The insulation layer 102 includes electrode terminals 106 and ball lands 104 on a surface thereof. The wiring pattern 108 formed on the insulation layer 102 electrically connects the electrode terminals 106 and the ball lands 104 with each other. Further, as shown in FIG. 1, portions of the wiring patterns 108 are removed between the electrode terminals 106 and the ball lands 104.

A solder resist 112 is applied over the insulation layer 102 including the wiring patterns 108, the electrode terminals 106, and the ball lands 104 to expose the ball lands 104.

Conductive members are selectively formed in the regions where the wiring patterns 108 for electrically connecting the electrode terminals 106 and the ball lands 104 with each other are partially removed.

According to the present embodiment, the conductive members 110 may comprise any one of an anisotropic conductive film (ACF), an anisotropic conductive ink (ACI), and a conductive polymer. The conductive polymer contains conductive particles in order to improve the electrical characteristics of the conductive members 110.

At this time, as shown in FIGS. 2 and 3, the conductive members 110, which are selectively formed in the regions where the wiring patterns 108 are partially removed, to be pressed or not to be pressed, and in this state, the wiring patterns 108 selectively connect the electrode terminals 106 and the ball lands 104 with each other in conformity with the kinds of respective desired packages.

Meanwhile, as shown in FIGS. 4 and 5, the solder resist 112 may be formed over the PCB 100, including the ball lands, the wiring patterns, and the electrode terminals to only expose the conductive members 110.

In this case, according to the present invention, the electrode terminals 106 and can be selectively connected to respective ball lands 104 by the conductive members 110. The conductive members 110 are selectively formed in the regions where the wiring patterns 108 are partially removed and may be pressed, or not pressed, according to the design requirements of a desired printed circuit board.

Figure 6:
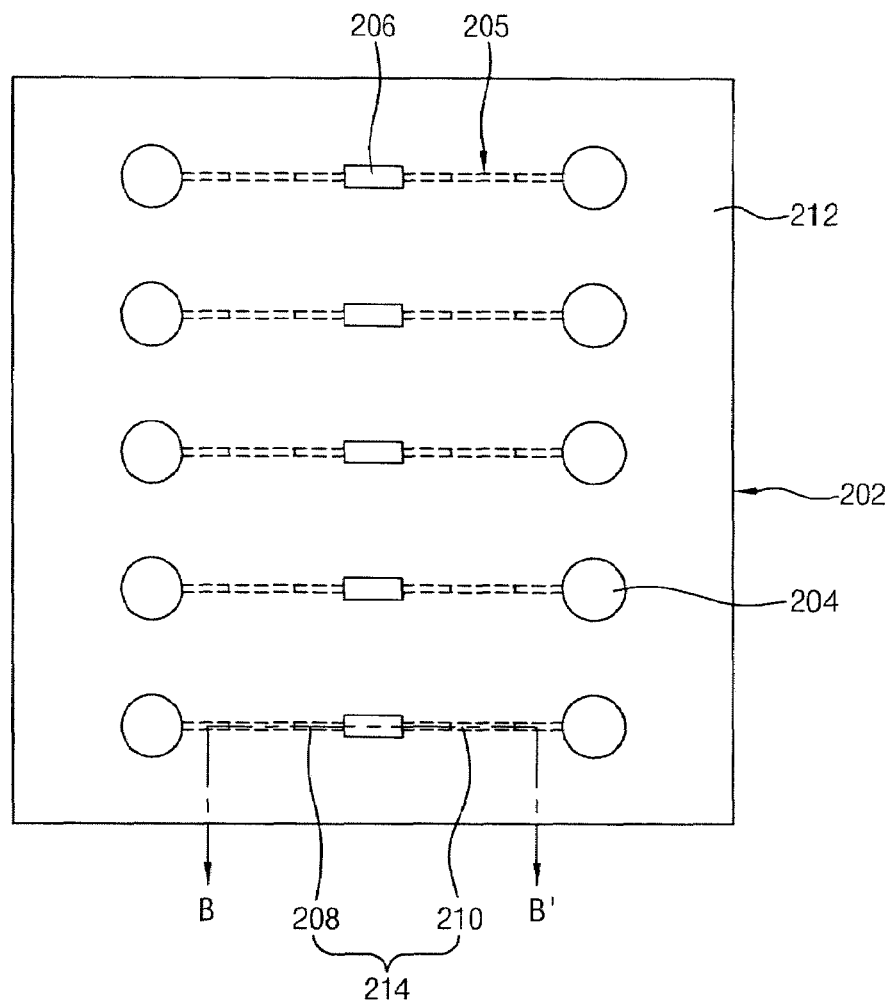
FIG. 6 is a plan view showing a printed circuit board in accordance with a second embodiment of the present invention.
Figure 7:
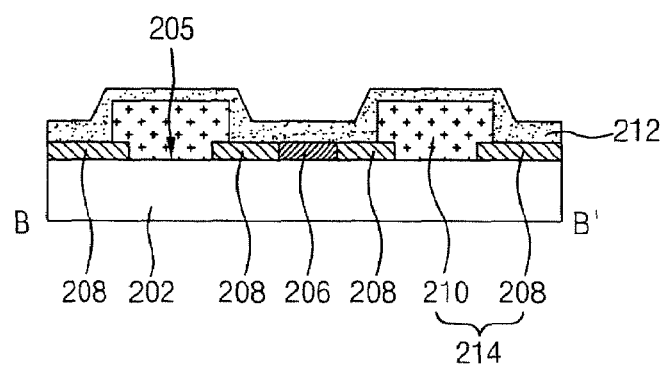
FIGS. 7 through 9 are cross-sectional views taken along the line B-B' of FIG. 6, showing three exemplary printed circuit boards in accordance with the second embodiment of the present invention.
Figure 8:
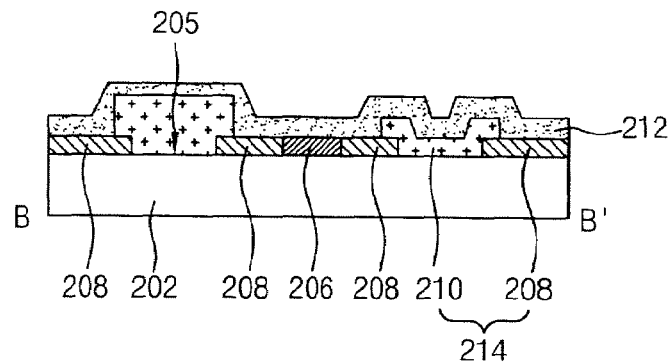
Figure 9:
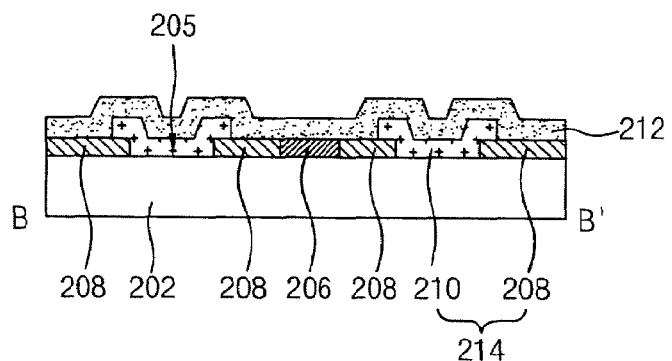
Figure 10:
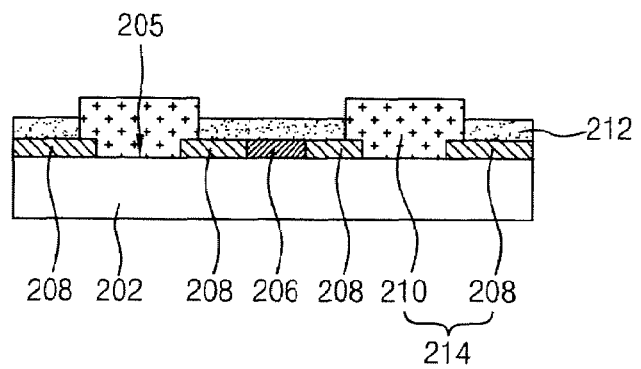
FIGS. 10 through 12 are cross-sectional views showing the printed circuit board in accordance with the second embodiment of the present invention.
Figure 11:
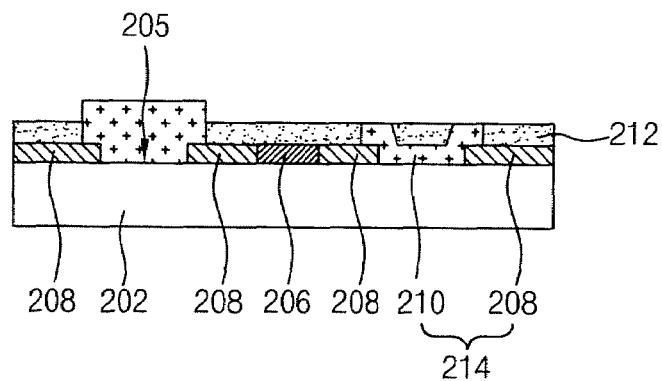
Figure 12:
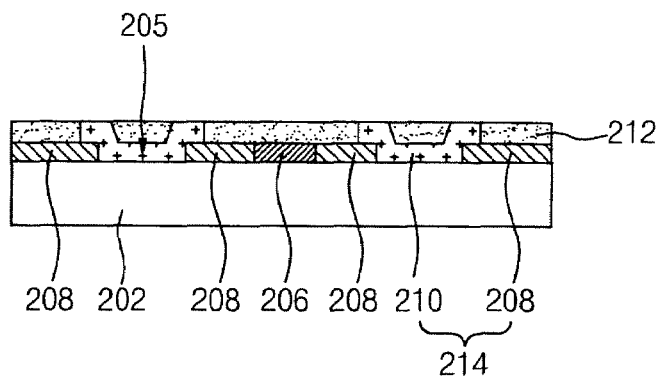

FIG. 6 is a plan view showing a printed circuit board in accordance with a second embodiment of the present invention. FIGS. 7 through 9 are cross-sectional views taken along the line B-B' of FIG. 6, showing three exemplary printed circuit boards in accordance with the second embodiment of the present invention. FIGS. 10 through 12 are cross-sectional views employed in explaining the printed circuit board in accordance with the second embodiment of the present invention. The printed circuit board in accordance with the second embodiment of the present invention will be described below.

Referring to FIG. 6, in a printed circuit board 200 in accordance with a second embodiment of the present invention, wiring patterns 214 are formed on an insulation layer 202. The insulation layer includes electrode terminals 206 and ball lands 204 disposed on a surface thereof. The wiring patterns 214 are positioned between the electrode terminals 206 and the ball lands 204 so as to electrically connect them with each other.

The wiring patterns 214 are composed of connection wiring lines 208, which are partially removed in regions 205, and conductive members 210, which are formed in regions 205 where the connection wiring lines 208 are removed.

The conductive members 210 may comprise any one of an ACF, an ACI, and a conductive polymer. The conductive polymer contains conductive particles in order to improve the electrical characteristics of the conductive members 210.

At this time, as shown in FIGS. 7 through 9, the wiring patterns 214 selectively connect the electrode terminals 206 and the ball lands 204 with each other in conformity with the requirements of various respective desired packages, in a state wherein the end portions of the wiring patterns 214 (the conductive members 210 formed in the regions 205 where the connection wiring lines 208 are partially removed) may be all pressed, may not be pressed, or may be selectively pressed.

A solder resist 212 is applied over the insulation layer 202 including the wiring patterns 214, the electrode terminals 206, and the ball lands 204, and the solder resist 212 is applied such that the ball lands 204 are exposed, that is, the ball lands 204 the solder resist 212 does not cover the ball lands 204.

Meanwhile, as shown in FIGS. 10 through 12, the solder resist 212 may be formed to have a shape that exposes only the conductive members 210.

Figure 13A:
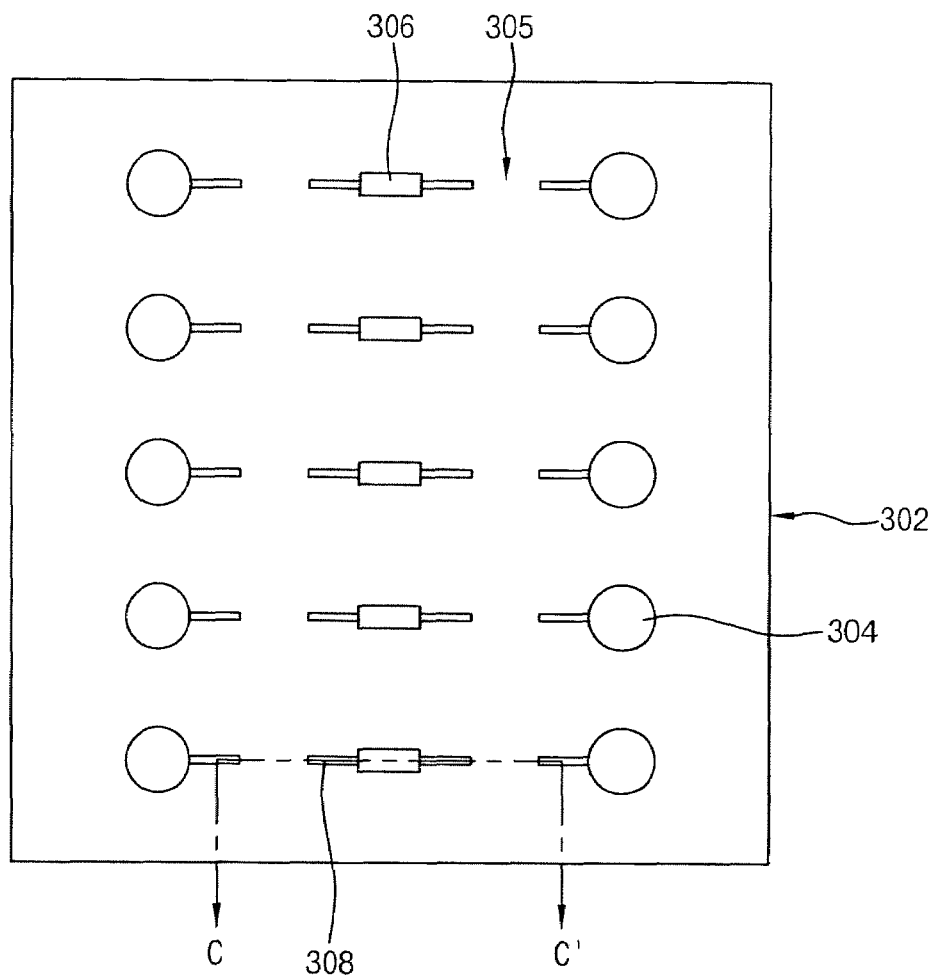
FIGS. 13A through 13C are plan views showing the processes of a method for manufacturing the printed circuit board in accordance with the second embodiment of the present invention.
Figure 13B:
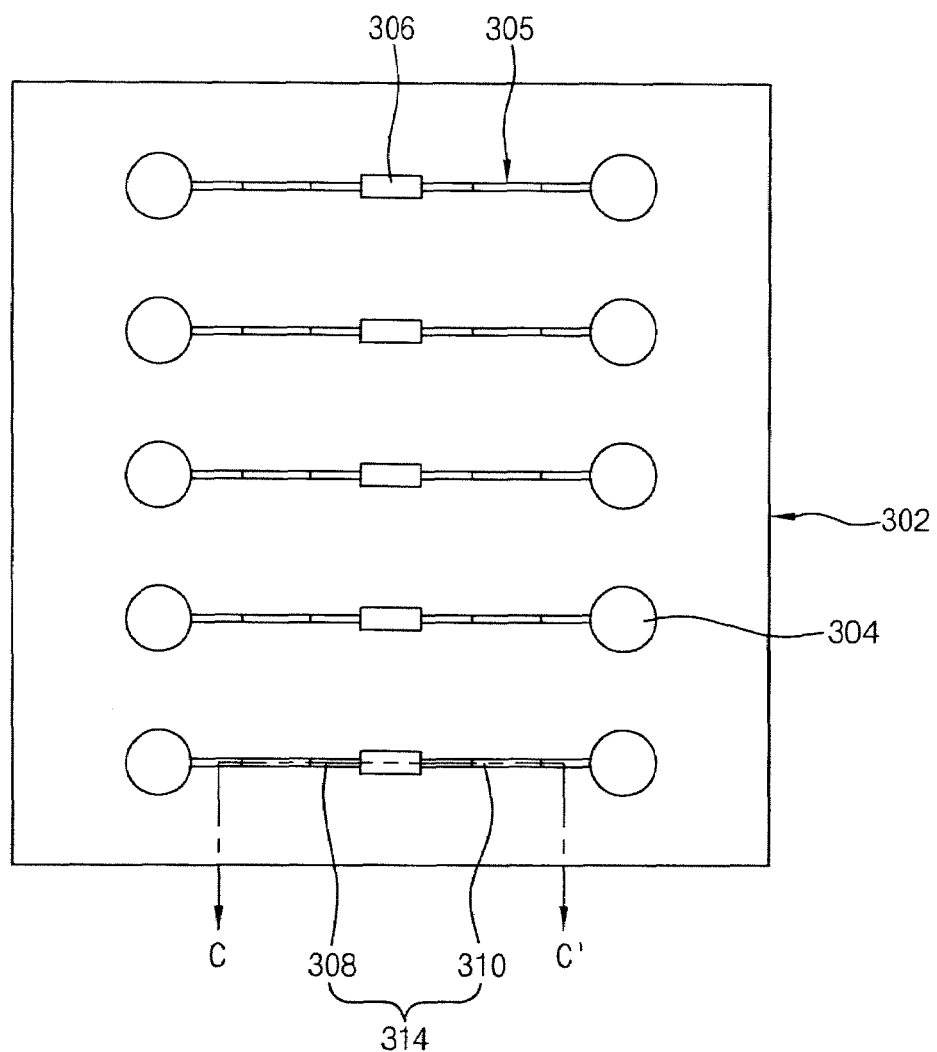
Figure 13C:
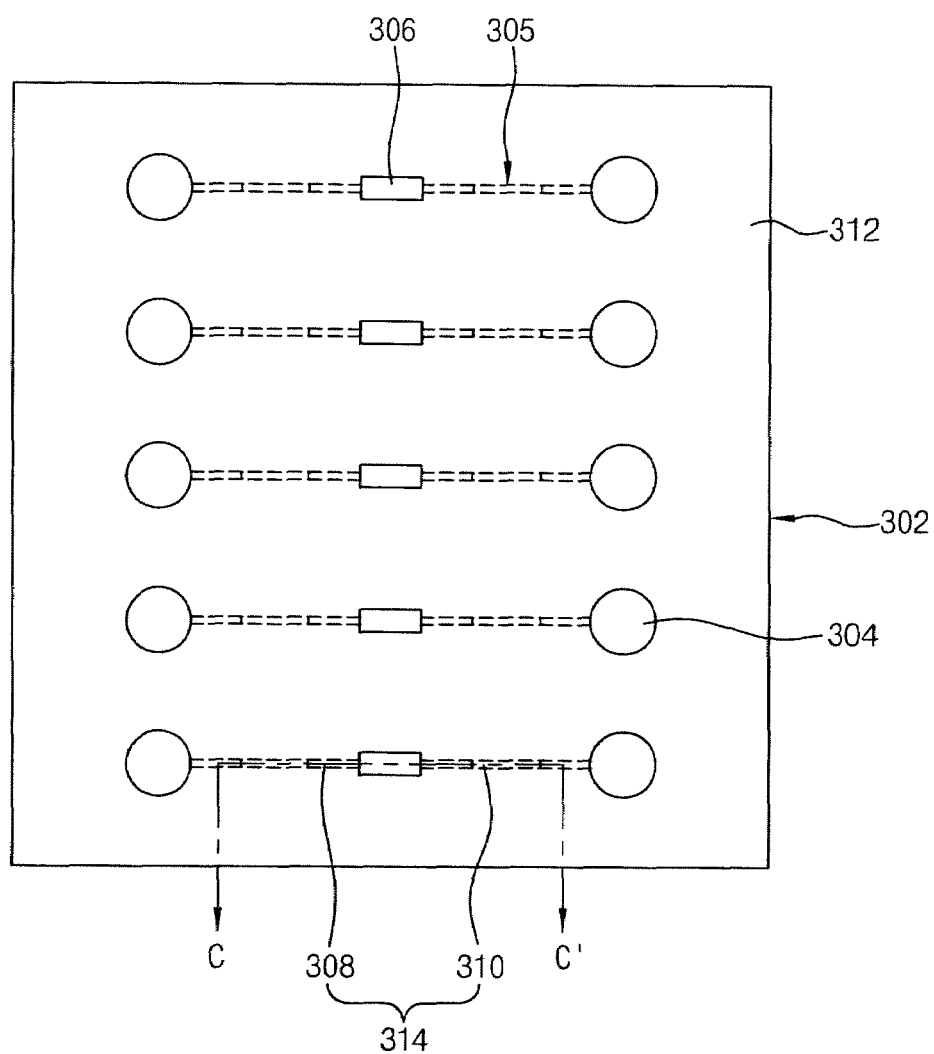
Figure 14A:
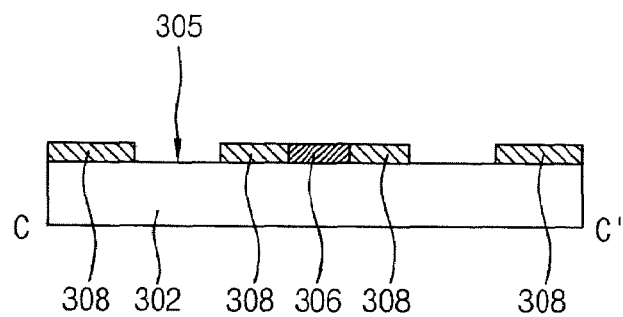
FIGS. 14A through 14C are cross-sectional views taken along the lines C-C' of FIGS. 13A through 13C, showing the processes of the method for manufacturing the printed circuit board in accordance with the second embodiment of the present invention.
Figure 14B:
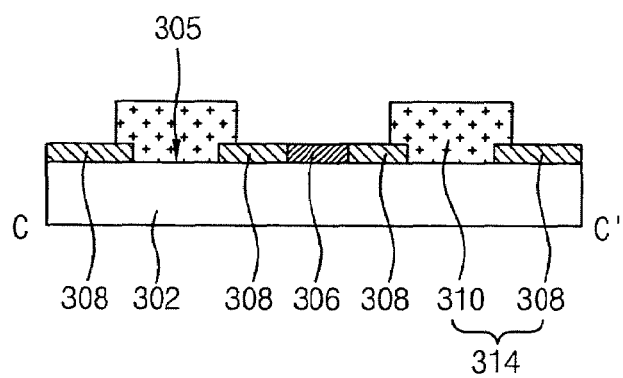
Figure 14C:
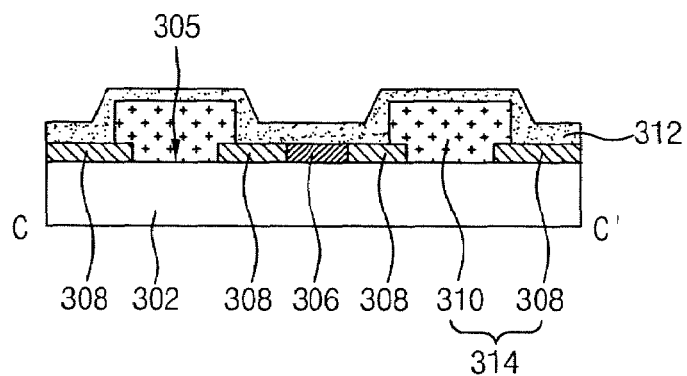
Figure 15:
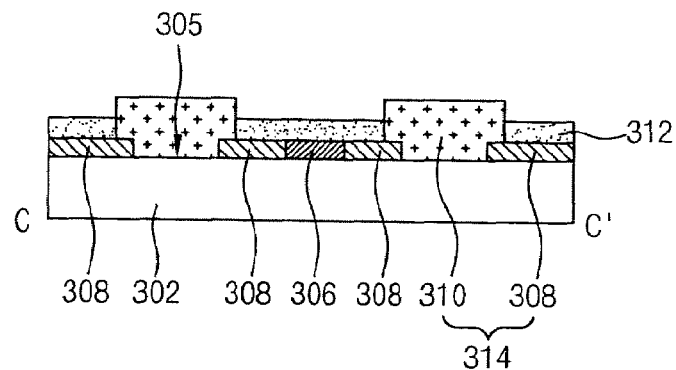
FIGS. 15 through 17 are cross-sectional views employed in explaining the method for manufacturing the printed circuit board in accordance with the second embodiment of the present invention.
Figure 16:
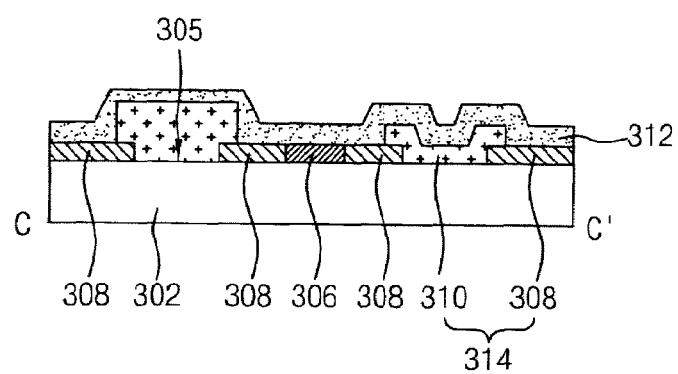
Figure 17:
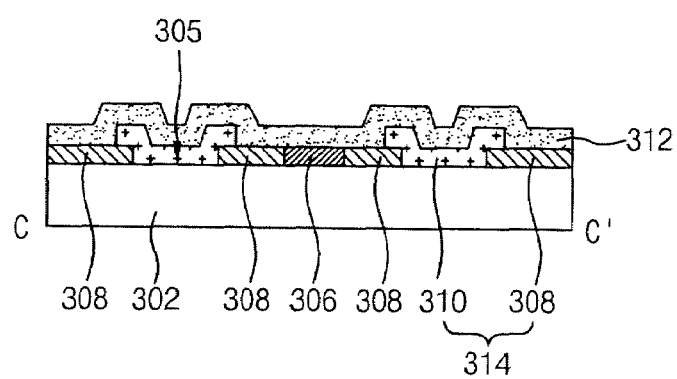

FIGS. 13A through 13C are plan views showing the processes of a method for manufacturing the printed circuit board in accordance with the second embodiment of the present invention. FIGS. 14A through 14C are cross-sectional views taken along the lines C-C' of FIGS. 13A through 13C, showing the processes of the method for manufacturing the printed circuit board in accordance with the second embodiment of the present invention. FIGS. 15 through 17 are cross-sectional views showing the method for manufacturing the printed circuit board in accordance with the second embodiment of the present invention. The method for manufacturing the printed circuit board in accordance with the second embodiment of the present invention will be described below.

Referring to FIGS. 13A and 14A, connection wiring lines 308 are formed on an insulation layer 302. Electrode terminals 306 and ball lands 304 are formed on the upper surface of the insulation layer 302 and are electrically connected to each other by the connection wiring lines 308.

At this time, the connection wiring lines 308 for electrically connecting the electrode terminals 306 and the ball lands 304 are partially removed in regions 305 such that the electrode terminals 306 and the ball lands 304 are electrically disconnected from each other and the upper surface of the insulation layer 302 is exposed. That is, a portion of the connection wiring lines 308 corresponding to the region 305 is removed such that the electrode terminal 306 and the ball land 304 are electrically disconnected from each other.

Referring to FIGS. 13B and 14B, conductive members 310 are formed in the regions 305 where the connection wiring lines 308 are partially removed. Wiring patterns 314, which are comprised of the conductive members 310 formed in the regions 305 and the portions connection wiring lines 308 initially formed to electrically connect the electrode terminals 306 and the ball lands 304 with each other that remain after the portions of the conductive members 310 that correspond to the regions 305 have been removed.

In the present embodiment, the conductive members 310 comprise any one of an ACF, an ACI, and a conductive polymer. The conductive polymer contains conductive particles in order to improve the electrical characteristics of the conductive members 310.

Referring to FIGS. 13C and 14C, a solder resist 312 is applied over the upper surface of the insulation layer 302 including the wiring patterns 314 having the conductive members 310, and excluding the ball lands 304. That is, the ball lands 304 are exposed through the solder resist 312.

Alternatively, the solder resist 312 may be applied over the upper surface of the insulation layer 302 including the wiring patterns 314 which have the conductive members 310, to expose the ball lands 304 as well as the conductive members 310 as shown in FIG. 15.

Also, as shown in FIGS. 15 through 17, the conductive members 310 can be formed to be selectively pressed (i.e., pressed or not pressed) according to the kinds of respective packages used on a printed circuit board, such that the electrode terminals 306 and the ball lands 304 are electrically connected with or disconnected from each other.

As is apparent from the above description, in the present invention, when forming a printed circuit board, conductive members are formed in regions where wiring patterns are partially removed between ball lands and electrode terminals. As a consequence, solder balls to be connected with respective different signals can be attached to and electrically connected with an adaptable ball land to be adapted for the respective different types of packages.

As a result, in the present invention, additional manufacturing time and costs that will be incurred to change the design of a printed circuit board become eliminated. That is, according to the present invention, a single printed circuit board can be adapted for various different types of packages without requiring a change of design.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A printed circuit board comprising:
an insulation layer,
electrode terminals formed on an upper surface of the insulation layer,
ball lands formed on the upper surface of the insulation layer and separated from the electrode terminals;
wiring patterns formed on the upper surface of the insulation layer, interposed between the electrode terminals and the ball lands, and partially removed in predetermined regions; and
anisotropic conductive members formed in the predetermined regions where the wiring patterns are partially removed,
wherein some of the anisotropic conductive members are pressed if electrical connection between the electrode terminals and the ball lands is required, and the other anisotropic conductive members are not pressed if electrical connection between the electrode terminals and the ball lands is not required.

2. The printed circuit board according to claim 1, wherein the anisotropic conductive members comprise any one of an anisotropic conductive film (ACF) and an anisotropic conductive ink (ACI).

3. The printed circuit board according to claim 1, further comprising:
a solder resist applied over the insulation layer.

4. The printed circuit board according to claim 3, wherein the solder resist applied over the insulation layer exposes only the anisotropic conductive members.

5. The printed circuit board according to claim 3, wherein the solder resist applied over the insulation layer covers the anisotropic conductive members.

6. A printed circuit board comprising:
an insulation layer;
electrode terminals formed on an upper surface of the insulation layer;
ball lands formed on the upper surface of the insulation layer and separated from the electrode terminals; and
wiring patterns formed on the upper surface of the insulation layer and interposed between the electrode terminals and the ball lands, the wiring patterns comprising:
connection wiring lines which are partially removed in predetermined regions between the electrode terminals and the ball lands; and
anisotropic conductive members which are formed in the predetermined regions where the connection wiring lines are partially removed,
wherein some of the anisotropic conductive members are pressed if electrical connection between the electrode terminals and the ball lands is required, and the other anisotropic conductive members are not pressed if electrical connection between the electrode terminals and the ball lands is not required.

7. The printed circuit board according to claim 6, wherein the anisotropic conductive members comprise any one of an anisotropic conductive film (ACF) and an anisotropic conductive ink (ACI).

8. The printed circuit board according to claim 6, further comprising:
a solder resist applied over the insulation layer.

9. The printed circuit board according to claim 8, wherein the solder resist applied over the insulation layer exposes only the anisotropic conductive members.

10. The printed circuit board according to claim 8, wherein the solder resist applied over the insulation layer covers the anisotropic conductive members.

11. A method for manufacturing a printed circuit board, comprising the steps of:
forming an insulation layer having electrode terminals and ball lands separated from the electrode terminals on an upper surface thereof;
forming wiring patterns on the upper surface of the insulation layer to be interposed between the electrode terminals and the ball lands and to be composed of connection wiring lines which are partially removed in predetermined regions between the electrode terminals and the ball lands and anisotropic conductive members which are formed in the predetermined regions where the connection wiring lines are partially removed,
pressing selectively the anisotropic conductive members, by pressing the anisotropic conductive members if the electrical connection between the electrode terminals the ball lands is required, and not pressing the anisotropic conductive members if electrical connection between the electrode terminals and the ball lands is not required.

12. The method according to claim 11, wherein the anisotropic conductive members are formed using any one of an anisotropic conductive film (ACF) and an anisotropic conductive ink (ACI).

13. The method according to claim 11, wherein, after the step of forming the wiring patterns, the method further comprises the step of:
applying a solder resist over the insulation layer including the anisotropic conductive members.

14. The method according to claim 13, wherein, in the step of applying the solder resist, the solder resist is formed to expose only the anisotropic conductive members.

15. The method according to claim 13, wherein, in the step of applying the solder resist, the solder resist is formed to cover the anisotropic conductive members.

* * * * *